United States Patent
Degani et al.

(10) Patent No.: US 11,387,841 B2
(45) Date of Patent: Jul. 12, 2022

(54) APPARATUS AND METHOD FOR INTERPOLATING BETWEEN A FIRST SIGNAL AND A SECOND SIGNAL

(71) Applicant: Intel IP Corporation, Santa Clara, CA (US)

(72) Inventors: Ofir Degani, Nes-Ammin (IL); Rotem Banin, Even-Yehuda (IL); Assaf Ben-Bassat, Haifa (IL); Bassam Khamaisi, Kafer Kana (IL); Gil Asa, Zikhron Yaakov (IL)

(73) Assignee: INTEL CORPORATION, Santa Clara, CA (US)

( * ) Notice: Subject to any disclaimer, the term of this patent is extended or adjusted under 35 U.S.C. 154(b) by 68 days.

(21) Appl. No.: 16/650,036

(22) PCT Filed: Dec. 15, 2017

(86) PCT No.: PCT/US2017/066555
§ 371 (c)(1),
(2) Date: Mar. 24, 2020

(87) PCT Pub. No.: WO2019/117932
PCT Pub. Date: Jun. 20, 2019

(65) Prior Publication Data
US 2021/0367610 A1    Nov. 25, 2021

(51) Int. Cl.
*H03K 5/13* (2014.01)
*H03M 1/82* (2006.01)
(Continued)

(52) U.S. Cl.
CPC .............. *H03M 1/82* (2013.01); *H03K 5/01* (2013.01); *H03K 2005/00058* (2013.01)

(58) Field of Classification Search
CPC .. H03M 1/82; H03K 5/01; H03K 2005/00058
(Continued)

(56) References Cited

U.S. PATENT DOCUMENTS 6,052,701 A * 4/2000 Koslov ............... H04L 27/2071
332/103
6,982,578 B2 * 1/2006 Lee ....................... H03L 7/0816
327/158
(Continued)

*Primary Examiner* — Ryan Jager
(74) *Attorney, Agent, or Firm* — 2SPL Patent Attorneys PartG mbB; Yong Beom Hwang

(57) ABSTRACT

An apparatus for interpolating between a first signal and a second signal is provided. The apparatus includes a first plurality of interpolation cells configured to generate a first interpolation signal at a first node. At least one of the first plurality of interpolation cells is configured to supply, based on a first number of bits of a control word, at least one of the first signal and the second signal to the first node. The apparatus further includes a second plurality of interpolation cells configured to generate a second interpolation signal at a second node. At least one of the second plurality of interpolation cells is configured to supply, based on a second number of bits of the control word, at least one of the first signal and the second signal to the second node. The apparatus additionally includes an interpolation circuit configured to weight the second interpolation signal based on a weighting factor, and to combine the first interpolation signal and the weighted second interpolation signal to generate a third interpolation signal.

25 Claims, 8 Drawing Sheets

(51) Int. Cl.
*H03K 5/01* (2006.01)
*H03K 5/00* (2006.01)

(58) Field of Classification Search
USPC .......................................................... 327/261
See application file for complete search history.

(56) References Cited

U.S. PATENT DOCUMENTS

| | | | |
|---|---|---|---|
| 7,173,463 B2* | 2/2007 | Lee | H03L 7/0816 327/158 |
| 7,274,236 B2* | 9/2007 | Lee | H03H 11/265 327/158 |
| 7,339,408 B2* | 3/2008 | Lee | G11C 7/22 327/158 |
| 7,825,710 B2* | 11/2010 | Kim | H03L 7/0814 327/158 |
| 8,451,042 B2 | 5/2013 | Erdogan | |
| 8,824,616 B1 | 9/2014 | Gopalakrishnan | |
| 8,901,981 B2* | 12/2014 | Park | H03K 5/13 327/276 |
| 8,912,837 B2* | 12/2014 | De Caro | H03K 5/14 327/276 |
| 8,928,384 B2* | 1/2015 | Rylov | H03K 5/131 327/276 |
| 9,531,364 B2* | 12/2016 | Ma | H03K 5/1565 |
| 10,110,208 B2* | 10/2018 | Ma | H03K 5/135 |
| 10,312,894 B2* | 6/2019 | Ma | H03K 5/135 |
| 2004/0252896 A1* | 12/2004 | Lee | H04N 19/577 382/236 |
| 2006/0029160 A1* | 2/2006 | Kim | H03L 7/0812 375/326 |
| 2006/0274874 A1* | 12/2006 | Kumar | H04L 7/033 375/362 |
| 2012/0306552 A1 | 12/2012 | Erdogan | |
| 2013/0223755 A1* | 8/2013 | Wyville | G06K 9/0051 382/260 |
| 2014/0002173 A1* | 1/2014 | Park | H03K 5/13 327/356 |
| 2015/0054558 A1* | 2/2015 | Jang | H03K 5/131 327/250 |

\* cited by examiner

APPARATUS AND METHOD FOR INTERPOLATING BETWEEN A FIRST SIGNAL AND A SECOND SIGNAL

FIELD

The present disclosure relates to signal interpolation. In particular, examples relate to an apparatus and a method for interpolating between a first signal and a second signal.

BACKGROUND

A Digital-to-Time Converter (DTC) is an important block in multiple applications ranging from digital polar transmitters (DTX) over clocking schemes to wire interconnect. The DTC is employed for time (or phase) manipulation of a desired signal by directly converting a digital word to a delay shift.

A DTC is commonly a segmented structure built from a coarse delay control using a Multiplying Delay Locked-Loop (MDLL) or a Multi-Modulus Divider (MMD), and a fine delay control using a Digitally Controlled Edge Interpolators (DCEI) or a Digitally Controlled Delay Line (DCDL). DCEI-DTCs enjoy several benefits over DCDL-DTCs like self-alignment to the coarse delay control, full and exact 2πL coverage, lower power and low noise.

Nevertheless, extending the number of bits for the digital word of the DCEI-DTC results in doubling the power for every extra bit due to the thermometric array design of the DCEI-DTC, which may limit its practical resolution usage.

Hence, there may be a desire for an improved phase interpolation concept.

BRIEF DESCRIPTION OF THE FIGURES

Some examples of apparatuses and/or methods will be described in the following by way of example only, and with reference to the accompanying figures, in which.

DETAILED DESCRIPTION

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly or operably connected or coupled or via one or more intervening elements. If two elements A and B are combined using an "or", this is to be understood to disclose all possible combinations, i.e. only A, only B as well as A and B. An alternative wording for the same combinations is "at least one of A and B". The same applies for combinations of more than 2 Elements.

The terminology used herein for the purpose of describing particular examples is not intended to be limiting for further examples. Whenever a singular form such as "a", "an" and "the" is used and using only a single element is neither explicitly or implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises", "comprising", "includes" and/or "including," when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong.

Figure 1:
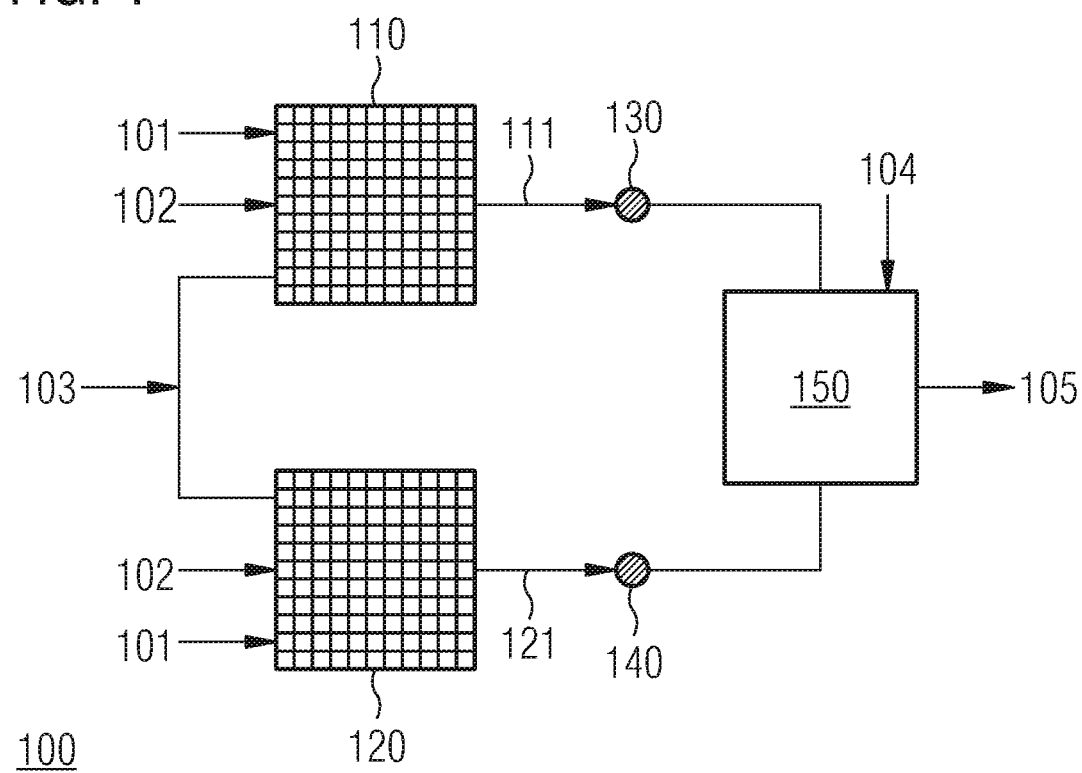
FIG. 1 illustrates an example of an apparatus for interpolating between a first signal and a second signal.

FIG. 1 illustrates an exemplary apparatus 100 for interpolating between a first signal 101 and a second signal 102. The second signal 102 is a phase shifted replica or equivalence of the first signal 101. For example, first signal 101 and second signal 102 may be oscillation signals.

Apparatus 100 comprises a first plurality of interpolation cells 110 configured to generate a first interpolation signal 111 at a first (circuit) node 130. Each of the first plurality of interpolation cells 110 is configured to receive the first signal 101 and the second signal 102 selectively, concurrently or simultaneously. At least one of the first plurality of interpolation cells 110 is configured to supply, based on a first number of bits of a control word 103, at least one of the first signal 101 and the second signal 102 (i.e. the first signal 101, the second signal 102, or the first signal 101 and the second signal 102) to the first node 130. For example, a decoder circuit may receive the first number of bits of control word 103 and control one or more of the first plurality of interpolation cells 110 to supply the first signal 101 and/or the second signal 102 to the first node 130. Based on the code (value) represented by the first number of bits of control word 103, the decoder circuit may, e.g., control a first subset of the first plurality of interpolation cells 100 to supply the first signal 101 to the first node 130, a second subset of the first plurality of interpolation cells 110 to supply the second signal 102 to the first node 130 and/or a third subset of the first plurality of interpolation cells 110 to supply the first signal 101 and the second signal 102 to the first node 130. The signals supplied to the first node 130 by the first plurality of interpolation cells 110 sum at the first node 130 to the resulting first interpolation signal 111. The first interpolation signal 111 represents a first interpolation between the first signal 101 and the second signal 102.

Further, apparatus 100 comprises a second plurality of interpolation cells 120 configured to generate a second interpolation signal 121 at a second (circuit) node 140. Also each of the second plurality of interpolation cells 120 is configured to receive the first signal 101 and the second signal 102. At least one of the second plurality of interpolation cells 120 is configured to supply, based on a second number of bits of the control word 103, at least one of the first signal 101 and the second signal 102 (i.e. the first signal 101, the second signal 102, or the first signal 101 and the second signal 102) to the second node 140. For example, the decoder circuit may receive the second number of bits of control word 103 and control one or more of the second plurality of interpolation cells 120 to supply the first signal 101 and/or the second signal 102 to the second node 140. Based on the code (value) represented by the second number of bits of control word 103, the decoder circuit may, e.g., control a first subset of the second plurality of interpolation cells 120 to supply the first signal 101 to the second node 140, a second subset of the second plurality of interpolation cells 120 to supply the second signal 102 to the second node 140 and/or a third subset of the second plurality of interpolation cells 120 to supply the first signal 101 and the second signal 102 to the second node 140. The signals supplied to the second node 140 by the second plurality of interpolation cells 120 sum at the second node 140 to the resulting second interpolation signal 121. The second interpolation signal 121 represents a second interpolation between the first signal 101 and the second signal 102.

The first plurality of interpolation cells 110 and the second plurality of interpolation cells 120 are controlled based on different numbers of bits of control word 103. The first number of bits and the second number of bits of control word 103 have different significance. This is, however, not taken into account (considered) when generating the first interpolation signal 111 and the second interpolation signal 121. In order to properly scale the contributions (i.e. interpolation signals) of the first plurality of interpolation cells 110 and the second plurality of interpolation cells 120, apparatus 100 additionally comprises an interpolation circuit 150. Interpolation circuit 150 is coupled to first node 130 and second node 140. Further, interpolation circuit 150 is configured to weight the second interpolation signal 121 based on a weighting factor 104. Interpolation circuit 150 is then configured to combine the first interpolation signal 111 and the weighted second interpolation signal 121 to generate a third interpolation signal 105.

By weighting the second interpolation signal 121 before combining it with the first interpolation signal 111, the contribution of the second interpolation signal 121 to the third interpolation signal 105 is scaled to the significance of the second number of bits of control word 103 with respect to the significance of the first number of bits of control word 103.

Accordingly, apparatus 100 may allow to split up the interpolation between the first signal 101 and the second signal 102 of M bit accuracy (as represented by control word 103) into two (or more) interpolations of $M_1$ and $M_2$ bit accuracy (represented by the first number and the second number of bits of control word 103), wherein $M_1+M_2=M$. This may allow interpolation using a (significantly) reduced number of interpolation cells compared to conventional approaches. Accordingly, a current consumption for an interpolation of M bit accuracy may be (significantly) reduced compared to conventional approaches. Further, apparatus 100 may allow to (significantly) increase the dynamic range of the interpolation compared to conventional approaches since the increase in interpolation cells for each additional bit of accuracy is (far) less than for conventional approaches.

For example, the first plurality of interpolation cells 110 may be a thermometric array of interpolation cells. That is, the first plurality of interpolation cells 110 may comprise $2^{M_1}$ interpolation cells, and the second plurality of interpolation cells 120 may comprise $2^{M_2}-1$ interpolation cells. $M_1$ denotes the first number of bits of control word 103 and $M_2$ denotes the second number of bits of the control word 103.

If an interpolation with M=10 bit accuracy is desired, the first plurality of interpolation cells 110 may, e.g., comprise $2^{M_1}=2^3=8$ interpolation cells for the $M_1=3$ Least Significant Bits (LSB) of the control word, and the second plurality of interpolation cells 120 may comprise $2^{M_2}-1=2^7-1=127$ interpolation cells for the $M_2=7$ Most Significant Bits (MSB) of the control word. For taking into account the significance of the bits according to which the first interpolation signal 111 and the second interpolation 121 are generated by the first plurality of interpolation cells 110 and the second plurality of interpolation cells 120, interpolation circuit 150 weights (scales) the second interpolation 121. The weighting factor used by interpolation circuit 150 may, e.g., be based on the number of interpolation cells in the second plurality of interpolation cells 120. In other words, the one less cell in the second plurality of interpolation cells 120 is basically replaced by the first plurality of interpolation cells 110. In the above numerical example, the weighting factor may, hence, be 127.

Interpolation circuit 150 may, e.g., weight the second interpolation signal 121 by generating a number of replicas of the second interpolation signal 121 so that the total number of second interpolation signals 121 is equal to the weighting factor. The combination of the total number of second interpolation signals 121 may, hence, be understood as weighted second interpolation signal. The total number of second interpolation signals 121 is then combined with the single first interpolation signal 111. Referring to the above numerical example, the second interpolation signal 121 may be simultaneously (concurrently) supplied 63 times to a signal combiner, while at the same time the first interpolation signal 111 is only supplied once to the signal combiner. The resulting third interpolation signal 105 is, hence, in accordance with the interpolation factor indicated by the M=10 bit long code of control word 103.

For this exemplary interpolation with M=10 bit accuracy, 135 interpolation cells are required in total. Using a conventional single thermometric array of interpolation cells would require $2^M=2^{10}=1024$ interpolation cells. From the above numerical example, it is evident that apparatus 100 may allow interpolation using a (significantly) reduced number of interpolation cells. Therefore, apparatus 100 may allow to (significantly) reduce the current consumption for the interpolation.

Although apparatus 100 is described above in connection with single ended signals, apparatus 100 may optionally be implemented using fully differential signals. Accordingly, the first plurality of interpolation cells 110 may further be configured to generate a fourth interpolation signal at a fourth node, wherein the fourth interpolation signal is inverted with respect to the first interpolation signal. Similarly, the second plurality of interpolation cells 120 may further be configured to generate a fifth interpolation signal at a fifth node, wherein the fifth interpolation signal is inverted with respect to the second interpolation signal. The interpolation circuit 150 may be further be configured to weight the fifth interpolation signal based on the weighting factor 104, and to combine the fourth interpolation signal and the weighted fifth interpolation signal to generate a sixth interpolation signal. The sixth interpolation signal is, hence, inverted with respect to the third interpolation signal 105.

Apparatus 100 may optionally use third and further pluralities (arrays) of interpolation cells configured to generate further interpolation signals based on third and further numbers of bits of control word 103. The interpolation cell may accordingly scale the further interpolation signals based on the significance of the third and further numbers of bits of control word 103.

In general, apparatus 100 may comprise j pluralities of interpolation cells (i.e. j arrays of interpolation cells; j being an integer number greater than one), wherein each plurality (i.e. each array) of interpolation cells covers a number $M_i$ of in total $M=\Sigma_{i=1}^{j} M_i$ bits of control word 103. This is described below in connection with FIGS. 2 to 4, which describe more detailed examples of apparatuses for interpolating between a first signal and a second signal according to the proposed technique.

Figure 2:
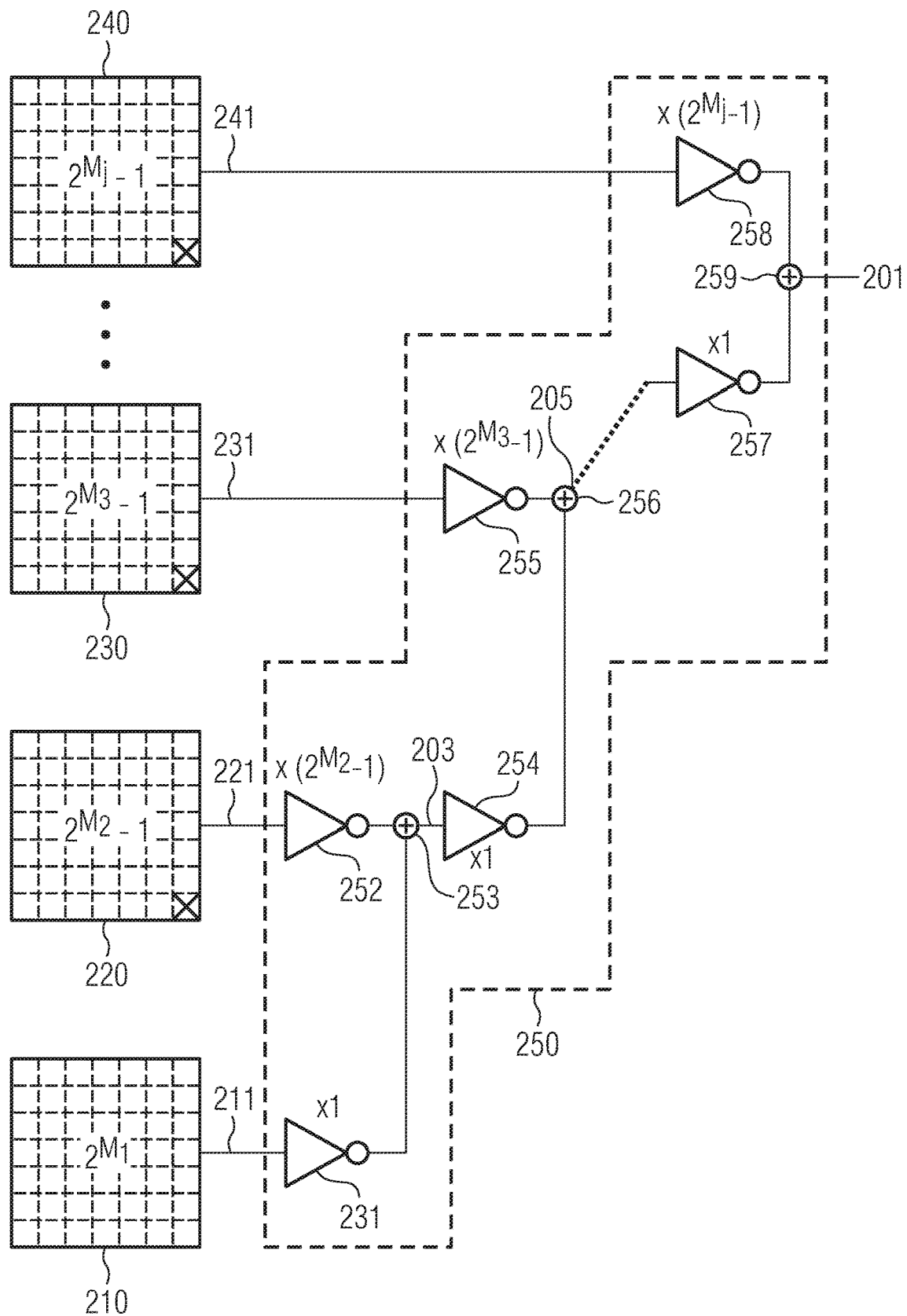
FIG. 2 illustrates a further example of an apparatus for interpolating between a first signal and a second signal.

FIG. 2 illustrates another apparatus 200 for interpolating between a first signal and a second signal. In contrast to apparatus 100, apparatus 200 comprises j pluralities of interpolation cells. The j pluralities of interpolation cells are represented by first plurality of interpolation cells 210, second plurality of interpolation cells 220, third plurality of interpolation cells 230 and $j^{th}$ plurality of interpolation cells 240.

The first plurality of interpolation cells 210 is configured to generate a first interpolation signal 211 at a first node (e.g. an output node of the first plurality of interpolation cells 210). The interpolation cells of the first plurality of interpolation cells 210 are configured to supply, based on (the code represented by) a first number of bits $M_1$ of a control word, the first signal and/or the second signal to the first node. The signals supplied to the first node by the first plurality of interpolation cells 210 sum at the first node to the resulting first interpolation signal 211.

The second plurality of interpolation cells 220 is configured to generate a second interpolation signal 221 at a second node (e.g. an output node of the second plurality of interpolation cells 220). The interpolation cells of the second plurality of interpolation cells 220 are configured to supply, based on (the code represented by) a second number of bits $M_2$ of the control word, the first signal and/or the second signal to the second node. The signals supplied to the second node by the second plurality of interpolation cells 220 sum at the second node to the resulting second interpolation signal 221.

The first plurality of interpolation cells 210 as well as the second plurality of interpolation cells 220 is a thermometric array of interpolation cells. Accordingly, the first plurality of interpolation cells 210 comprises $2^{M_1}$ interpolation cells, whereas the second plurality of interpolation cells 220 comprises $2^{M_2}-1$ interpolation cells. The first plurality of interpolation cells 210 effectively corresponds to the one less cell in the second plurality of interpolation cells 220.

The first number of bits $M_1$ of the control word represents the $M_1$ LSBs of the control word, whereas the second number of bits $M_2$ of the control word represents the $M_2$ more significant bit of the control word. Considering the different significance of the first number of bits $M_1$ and the second number of bits $M_2$, the second interpolation signal 221 is not scaled with respect to the first interpolation signal. This is done by interpolation circuit 250.

Therefore, interpolation circuit 250 comprises one first inverter 251 configured to receive the first interpolation signal 211. Further, interpolation circuit 250 comprises a plurality of second inverters 252 each configured to receive the second interpolation signal 221. A signal combiner 253 of interpolation circuit 250 is configured to combine the outputs of the first inverter 251 and the second inverters 252 to the third interpolation signal 203.

As described above, the weighting factor for scaling the second interpolation signal 221 is based on the number of interpolation cells in the second plurality of interpolation cells 220. In the example of FIG. 2, the weighting factor is, hence, $2^{M_2}-1$. Accordingly, the number of the second inverters 252 is equal to the weighting factor. That is, interpolation circuit 250 comprises $2^{M_2}-1$ second inverters 252.

Accordingly, the inverted second interpolation signal is simultaneously (concurrently) supplied $2^{M_2}-1$ times to signal combiner 253 by the $2^{M_2}-1$ second inverters 252, while the inverted first interpolation signal is supplied once to signal combiner 253 by the single first inverter 251. Signal combiner 253 outputs the third interpolation signal 203.

As described above, apparatus 200 comprises further pluralities of interpolation cells for processing further numbers of bits of the control word. In particular, apparatus 200 comprises a third plurality of interpolation cells 230 configured to generate a fourth interpolation signal 231 at a third node (e.g. an output node of the third plurality of interpolation cells 230).

The interpolation cells of the third plurality of interpolation cells 230 are configured to supply, based on a third number of bits $M_3$ of the control word, the first signal and/or the second signal to the third node. The signals supplied to the third node by the third plurality of interpolation cells 230 sum at the third node to the resulting fourth interpolation signal 231.

Also the third plurality of interpolation cells 230 is a thermometric array of interpolation cells. Accordingly, the third plurality of interpolation cells 230 comprises $2^{M_3}-1$ interpolation cells.

The third number of bits $M_3$ of the control word represents $M_3$ bits of the control word that are more significant than the second number of bits $M_2$ of the control word.

Considering the different significance of the third number of bits $M_3$ and the combination of the first number of bits $M_1$ and the second number of bits $M_2$, the fourth interpolation signal 231 is not scaled with respect to the third interpolation signal 203. This is again done by interpolation circuit 250. Interpolation circuit 250 is configured to weight the fourth interpolation signal 231 using a second weighting factor. Further, interpolation circuit 250 is configured to combine the third interpolation signal 203 and the weighted fourth interpolation signal to a fifth interpolation signal 205.

Similarly to the above described scaling, the second weighting factor for scaling the fourth interpolation signal 231 is based on the number of interpolation cells in the third plurality of interpolation cells 230. In the example of FIG. 2, the second weighting factor is, hence, $2^{M_3}-1$. Accordingly, interpolation circuit 250 comprises one third inverter 254 configured to receive the third interpolation signal, and a plurality of fourth inverters 255 each configured to receive the fourth interpolation signal 231. The number of the fourth inverters 255 is equal to the second weighting factor, i.e., interpolation circuit 250 comprises $2^{M_3}-1$ fourth inverters 255.

Accordingly, the inverted fourth interpolation signal is simultaneously (concurrently) supplied $2^{M_3}-1$ times to second signal combiner 256 by the $2^{M_3}-1$ fourth inverters 255, while the inverted third interpolation signal is supplied once to second signal combiner 256 by the single third inverter 254. Second signal combiner 256 is configured to combine the outputs of the third inverter 254 and the fourth inverters 255 to the fifth interpolation signal 205.

As indicated by the dotted lines in FIG. 2, further pluralities of interpolation cells and further consecutive weighting stages of interpolation circuit 250 may be provided for processing further numbers of bits of the control word.

The $M_j$ MSBs of the control word are finally processed by the illustrated $j^{th}$ plurality (array) of interpolation cells 240. The interpolation cells of the $j^{th}$ plurality of interpolation cells 240 are configured to supply, based on the $M_j$ MSBs of the control word, the first signal and/or the second signal to a $j^{th}$ node. The signals supplied to the $j^{th}$ node by the $j^{th}$ plurality of interpolation cells 240 sum at the $j^{th}$ node to a resulting sixth interpolation signal 241. Accordingly, the $j^{th}$ plurality of interpolation cells 240 is configured to generate the sixth interpolation signal 241 at the $j^{th}$ node (e.g. an output node of the $j^{th}$ plurality of interpolation cells 240).

Also the $j^{th}$ plurality of interpolation cells 240 is a thermometric array of interpolation cells. Accordingly, the $j^{th}$ plurality of interpolation cells 240 comprises $2^{M_j}-1$ interpolation cells. Considering the different significance of the $M_j$ MSBs of the control word and the remaining (less significant) bits of the control word, the sixth interpolation signal 241 is not scaled with respect to the interpolation signal generated based on the remaining bits of the control word. For the sake of simplicity, the fifth interpolation signal 205 will be considered as the interpolation signal that is generated based on the remaining bits of the control word. The weighting is again done by interpolation circuit 250. Interpolation circuit 250 is configured to weight the sixth interpolation signal 241 using a third weighting factor. Further, the interpolation circuit 250 is configured to combine the fifth interpolation signal 205 and the weighted sixth interpolation signal to an output interpolation signal 201 of apparatus 200.

Similar to what is described above, the third weighting factor for scaling the sixth interpolation signal 241 is based on the number of interpolation cells in the $j^{th}$ plurality of interpolation cells 240. In the example of FIG. 2, the weighting factor is, hence, $2^{M_j}-1$. Accordingly, interpolation circuit 250 comprises one fifth inverter 257 configured to receive the fifth interpolation signal 205, and a plurality of sixth inverters 258 each configured to receive the sixth interpolation signal 241. The number of the sixth inverters 258 is equal to the third weighting factor, i.e., interpolation circuit 250 comprises $2^{M_j}-1$ sixth inverters 258.

Accordingly, the inverted sixth interpolation signal is simultaneously (concurrently) supplied $2^{M_j}-1$ times to third signal combiner 259 by the $2^{M_j}-1$ sixth inverters 258, while the inverted fifth interpolation signal is supplied once to third signal combiner 259 by the single fifth inverter 257. Third signal combiner 259 is configured to combine the outputs of the fifth inverter 257 and the sixth inverters 258 to the output interpolation signal 201 of apparatus 200.

It is to be noted that the partitioning of apparatus 200 is merely an illustrative example for the proposed concept. In general, j arrays (pluralities) of interpolation cells may be used with each array covering any $M_j$ bits of in total $M=\Sigma_{i=1}^{j} M_i$ bits.

For example, for phase interpolation with 9 bit accuracy, two arrays may be used (i.e. j=2). One array of interpolation cells may cover the $M_1=3$ LSBs while the other array of interpolation cells covers the $M_2=6$ MSBs. That is, the number of interpolation cells in the LSB array is $2^{M_1}=8$, and the number of interpolation cells in the MSB array is $2^{M_2}-1=63$. The one less cell in the MSB array is basically replaced by the LSB array. For properly scaling the LSB array delay contribution with respect to the MSB array, the interpolation circuit (stage) uses a fixe ratio of 1:63 (i.e. the interpolation signal of the MSB array is weighted with the weighting factor 63).

The same 9 bit interpolation may alternatively be implemented with three arrays (i.e. j=3). A first array of interpolation cells may, e.g., cover the $M_1=3$ LSBs, while a second array of interpolation cells covers the $M_2=3$ Intermediate Significant Bits (ISB) and a third array of interpolation cells covers the $M_3=3$ MSBs. Accordingly, the interpolation circuit uses a ratio of 1:7 for the interpolation signals of the first and the second array (i.e. the interpolation signal of the ISB array is weighted with the weighting factor 7) and also a ratio for the combined interpolation signals of the first and the second array and the interpolation signal of the third array (i.e. the interpolation signal of the MSB array is weighted with the weighting factor 7).

The above numerical examples may again illustrate the advantages of the proposed technique in terms of power consumption. A conventional 9 bit array of interpolation cells would require in total 512 interpolation cells. For the above described j=2 implementation with the 6:3 splitting, 71 interpolation cells and 64 interpolating inverters are required in total. For the above described j=3 implementation with the 3:3:3 splitting, 22 interpolation cells and 16 interpolating inverters are required in total. The (significant) reduction of interpolation cells allows a (major) power reduction, while keeping the quantization noise at the same level.

Figure 3:
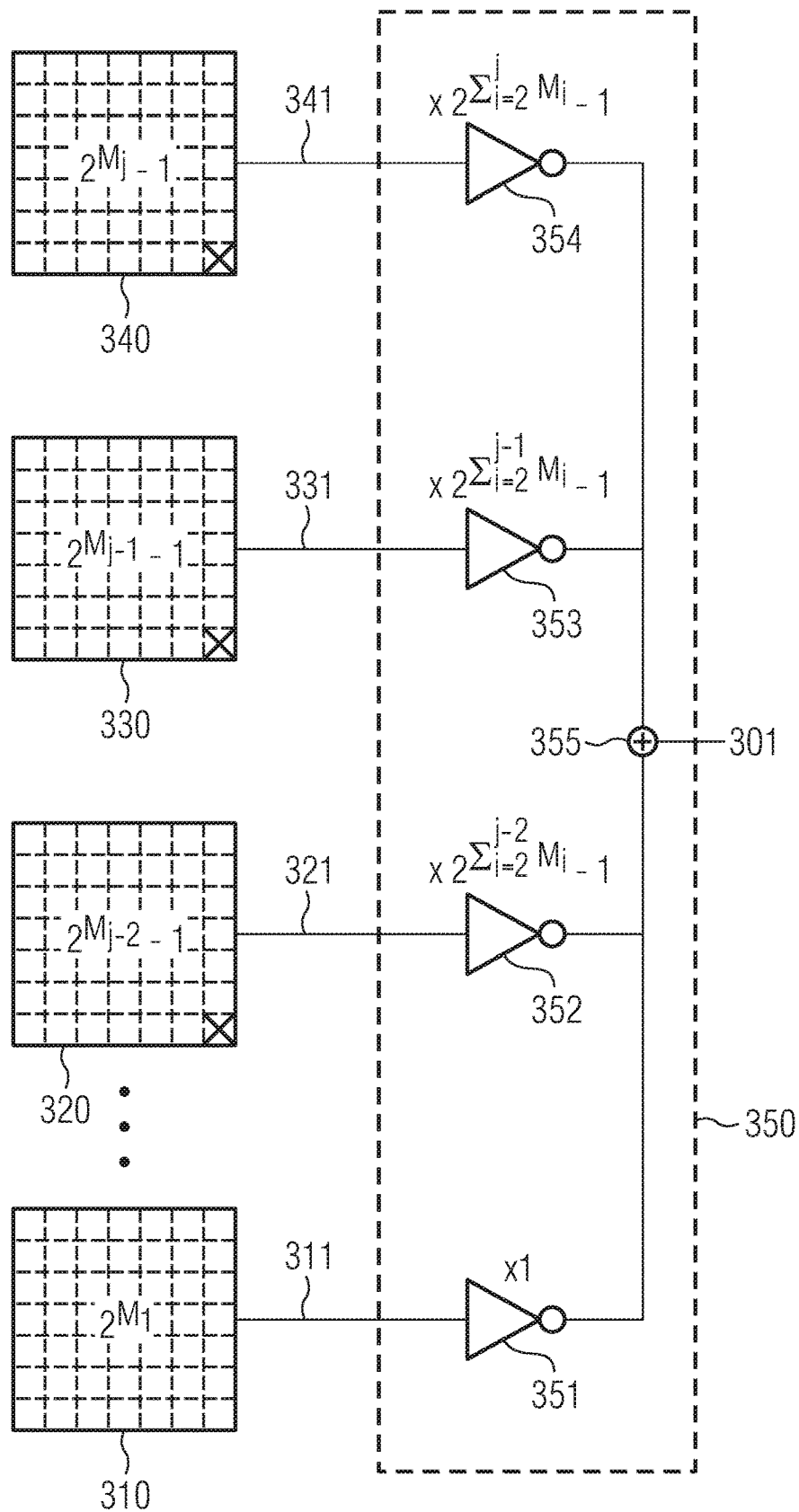
FIG. 3 illustrates a still further example of an apparatus for interpolating between a first signal and a second signal.

In the example of FIG. 2, the interpolation circuit used consecutive weighting. An alternative approach using parallel weighting is illustrated in FIG. 3. Using parallel weighting may be advantageous in terms of less absolute delay (for the price of a cumulative and larger interpolation circuit/array).

FIG. 3 illustrates apparatus 300 for interpolating between a first signal and a second signal. Also apparatus 300 comprises j pluralities (arrays) of interpolation cells. The j pluralities of interpolation cells are represented by a first plurality of interpolation cells 310, a $(j-2)^{th}$ plurality of interpolation cells 320, a $(j-1)^{th}$ plurality of interpolation cells 330 and $j^{th}$ plurality of interpolation cells 340. Since the different pluralities of interpolation cells are identical to the above described interpolation cells, a detailed described of the different pluralities of interpolation cells is omitted. For details of the interpolation cells, it is referred to the above description.

The first plurality of interpolation cells 310 is configured to generate a first interpolation signal 311 based on the $M_1$ LSBs of the control word, the $(j-2)^{th}$ plurality of interpolation cells 320 is configured to generate a $(j-2)^{th}$ interpolation signal 321 based on $M_{j-2}$ ISBs of the control word, the $(j-1)^{th}$ plurality of interpolation cells 330 is configured to generate a $(j-1)^{th}$ interpolation signal 331 based on $M_{j-1}$ ISBs of the control word and the $j^{th}$ plurality of interpolation cells 340 is configured to generate a $j^{th}$ interpolation signal 341 based on the $M_1$ MSBs of the control word.

Again, an interpolation circuit 350 is used for weighting and combining the individual interpolation signals provided by the pluralities of interpolation cells to the output interpolation signal 301 of apparatus 300.

Interpolation circuit 350 uses a specific weighting factor for weighting each individual interpolation signal provided by the pluralities of interpolation cells due to the different significance of the $M_i$ bits of the control word covered by one of the pluralities of interpolation cells and the $M_i$ less significant bits of the control word covered by one or more others of the pluralities of interpolation cells.

The individual weighting factors represent the relation between the significance of the bits processed by a specific plurality of interpolation cells and the significance of the less significant bits processed by the further pluralities of interpolation cells.

Since the first plurality of interpolation cells 310 covers the $M_1$ LSBs of the control word (and comprises $2^{M_1}$ interpolation cells), no weighting is required for the first interpolation signal 311 (i.e. the weighting factor may be considered as one). For each interpolation signal k out of the remaining j−1 interpolation signals covering the remaining MSBs of the control word, the respective weighting factor is $2^{\Sigma_{i=2}^{k}M_i}-1$ (with k=2, . . . , j and with $M_i$ denoting the number of bits covered by a specific one of the remaining j−1 pluralities of interpolation cells).

For example, for a second plurality of interpolation cells covering the next $M_2$ ISBs of the control word (and comprising $2^{M_2}-1$ interpolation cells), the weighing factor is $2^{\Sigma_{i=2}^{2}M_i}-1=2^{M_2}-1$. Similarly, for a third plurality of interpolation cells covering the next $M_3$ TSBs of the control word (and comprising $2^{M_3}-1$ interpolation cells), the weighing factor is $2^{\Sigma_{i=2}^{3}M_i}-1=2^{M_2+M_3}-1$. The factor for further pluralities of interpolation cells is determined analogous.

In order to implement the weighting, interpolation circuit 350 comprises again inverters configured to receive the respective interpolation signal from one of the plurality of interpolation cells. In contrast to the example of FIG. 2, the inverters of interpolation circuit 350 are not arranged consecutive but parallel. The respective number of the inverters for each plurality of interpolation cells is again equal to the weighting factor.

That is, the interpolation circuit 350 comprises one first inverter 351 configured to receive the first interpolation signal 311. Further, the interpolation circuit 350 comprises plurality of second inverters (not illustrated) configured to receive the second interpolation signal 311 generated by the second plurality of interpolation cells, etc. As illustrated in FIG. 3, interpolation circuit 350 comprises a plurality of $(j-2)^{th}$ inverters 352 configured to receive the $(j-2)^{th}$ interpolation signal 321, a plurality of $(j-1)^{th}$ inverters 353 configured to receive the $(j-1)^{th}$ interpolation signal 331 and a plurality of $j^{th}$ inverters 354 configured to receive the $j^{th}$ interpolation signal 341.

Since, the number of the respective inverters is equal to the respective weighting factor used for the individual interpolation signal, interpolation circuit 350 comprises $2^{\Sigma_{i=2}^{2}M_i}-1=2^{M_2}-1$ second inverters for the second interpolation signal, $2^{\Sigma_{i=2}^{3}M_i}-1=2^{M_2+M_3}-1$ third inverters for the third interpolation signal, . . . , $2^{\Sigma_{i=2}^{j-2}M_i}-1$ $(j-2)^{th}$ inverters 352 for the $(j-2)^{th}$ interpolation signal, $2^{\Sigma_{i=2}^{j-1}M_i}-1$ $(j-1)^{th}$ inverters 353 for the $(j-1)^{th}$ interpolation signal and $2^{\Sigma_{i=2}^{j}M_i}-1$ $j^{th}$ inverters 354 for the $j^{th}$ interpolation signal.

Further, interpolation circuit 350 comprises signal combiner 355, which is configured to combine the outputs of the inverters to the output interpolation signal 301 of apparatus 300. For example, signal combiner 355 is configured to combine outputs of the of the first inverter 351, the second inverters, the third inverters and optionally further inverters to the output interpolation signal 301 of apparatus 300.

Figure 4:
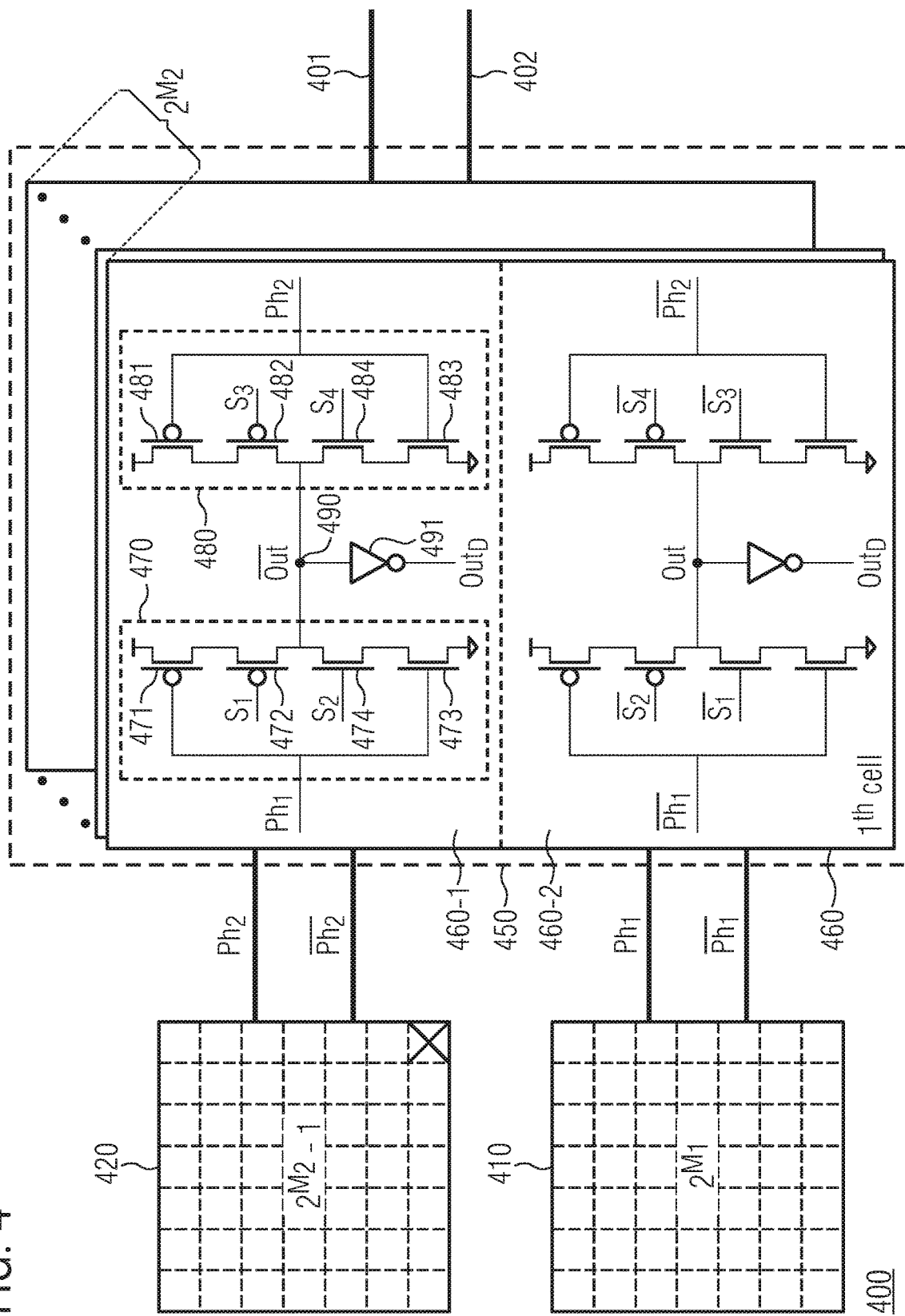
FIG. 4 illustrates another example of an apparatus for interpolating between a first signal and a second signal.

An example of a contention-free apparatus 400 for interpolating between a first signal and a second signal is illustrated in FIG. 4. Apparatus 400 is implemented differentially and comprises two pluralities of interpolation cells—the first plurality of interpolation cells 410 and the second plurality of interpolation cells 420. Since the basic operation of the different pluralities of interpolation cells is similar to the above described interpolation cells, a detailed described of the different pluralities of interpolation cells is omitted. For details of the interpolation cells, it is referred to the above description. The interpolation cells used in apparatus 400 merely distinguish from the above described interpolation cells in that they are implemented differentially.

The first plurality of interpolation cells 410 is configured to generate a first interpolation signal $Ph_1$ based on the $M_1$ LSBs of the control word, and the second plurality of interpolation cells 420 is configured to generate a second interpolation signal $Ph_2$ based on the $M_2$ MSBs of the control word. Accordingly, the first plurality of interpolation cells 410 comprises $2^{M_1}$ interpolation cells, and the second plurality of interpolation cells 420 comprises $2^{M_2}-1$ interpolation cells.

Since apparatus 400 is implemented differentially, the first plurality of interpolation cells 410 is further configured to generate a fourth interpolation signal $\overline{Ph_1}$ based on the $M_1$ LSBs of the control word, wherein the fourth interpolation signal $\overline{Ph_1}$ is inverted with respect to the first interpolation signal $Ph_1$. Similarly, the second plurality of interpolation cells 420 is further configured to generate a fifth interpolation signal $\overline{Ph_2}$ based on the $M_2$ MSBs of the control word, wherein the fifth interpolation signal $\overline{Ph_2}$ is inverted with respect to the second interpolation signal $Ph_2$.

Again, an interpolation circuit 450 is used for weighting and combining the individual interpolation signals provided by the pluralities of interpolation cells to the differential output interpolation signals 401 and 402 of apparatus 400. The interpolation circuit 450 is implemented contention free, i.e., no low impedance path between different voltage supply sources of apparatus 400 is formed by interpolation circuit 450.

Interpolation circuit 450 uses a specific weighting factor for weighting each individual interpolation signal provided by the pluralities of interpolation cells due to the different significance of the $M_1$ LSBs of the control word covered by the first plurality of interpolation cells 410 and the $M_2$ MSBs of the control word covered by the second plurality of interpolation cells 420. Therefore, interpolation circuit 450 comprises a plurality of inverter cells each configured to receive the first and second interpolation signals. The number of inverter cells is one more than the weighting factor, i.e. $2^{M_2}$ in the example of FIG. 4 (i.e. the weighting factor is equal to $2^{M_2}-1$). Since apparatus 400 is implemented differentially, each inverter cell comprises a first inverter cell section and a second inverter cell section. This is exemplarily illustrated in FIG. 4 for the $i^{th}$ inverter cell 460 (i=1, . . . , $2^{M_2}$). Inverter cell 460 comprises a first inverter cell section 460-1 for processing the first interpolation signal $Ph_1$ and the second interpolation signal $Ph_2$. Further, inverter cell 460 comprises a second inverter cell section 460-2 for processing the inverted signals of the pluralities of interpolation cells, the fourth interpolation signal $\overline{Ph_1}$ and the fifth interpolation signal $\overline{Ph_2}$.

Since the basic functionality of the first inverter cell section 460-1 and the second inverter cell section 460-2 is the same, merely the first inverter cell section 460-1 is described in the following.

The first inverter cell section 460-1 comprises a first inverter 470 and a second inverter 480. The first inverter 470 is configured to supply a first inverter output signal to an inverter cell node 490 based on the first interpolation signal $Ph_1$, a first control signal $S_1^i$ and a second control signal $S_2^i$. Similarly, the second inverter 480 is configured to supply a second inverter output signal to the inverter cell node 490 based on the second interpolation signal $Ph_2$, a third control signal $S_3^i$ and a fourth control signal $S_4^i$. The first inverter output signal and the second inverter output signal sum at the inverter cell node 490 to an intermediate signal $\overline{Out}$, which is inverted by a third inverter 491 to provide the $i^{th}$ first inverter cell section output signal $Out_{Di}$. The first inverter cell section output signals of all first inverter cell sections are summed to provide the output interpolation signal 401 of apparatus 400.

The first inverter 470 comprises a series connection of four transistors 471, 472, 473 and 474 of different conductivity types (e.g. p-type and n-type). The transistors 471 and 472 are serially coupled pull-up transistors. First pull-up transistor 471 is configured to receive the first interpolation signal $Ph_1$, and second pull-up transistor 472 is configured to receive the first control signal $S_1^i$. The transistor 473 and 474 are serially coupled pull-down transistors. First pull-down transistor 474 is configured to receive the first interpolation signal $Ph_1$, and second pull-down transistor 473 is configured to receive the second control signal $S_2^i$.

The second inverter 480 comprises a series connection of four transistors 481, 482, 483 and 484 of different conductivity types (e.g. p-type and n-type). The transistors 481 and 482 are serially coupled pull-up transistors. First pull-up transistor 481 is configured to receive the second interpolation signal $Ph_2$, and second pull-up transistor 482 is configured to receive the third control signal $S_3^i$. The transistor 483 and 484 are serially coupled pull-down transistors. First pull-down transistor 484 is configured to receive the second interpolation signal $Ph_2$, and second pull-down transistor 483 is configured to receive the fourth control signal $S_4^i$.

The four control signals $S_1^i$ to $S_4^i$ are based on the first inverter cell section output signal $Out_{Di}$ of the $i^{th}$ first inverter cell section 460-1. For example, the four control signals $S_1^i$ to $S_4^i$ may be defined as follows:

$$S_1^i = \overline{\overline{Sel_i} \cdot Out_{Di}} = \overline{Sel_i} + \overline{Out_{Di}} \quad (1)$$

$$S_2^i = \overline{\overline{Sel_i} + Out_{Di}} = Sel_i \cdot \overline{Out_{Di}} \quad (2)$$

$$S_3^i = \overline{\overline{Sel_i} \cdot \overline{Out_{Di}}} = Sel_i + Out_{Di} \quad (3)$$

$$S_4^i = \overline{\overline{Sel_i} + \overline{Out_{Di}}} = \overline{Sel_i} \cdot Out_{Di} \quad (4)$$

$Sel_i$ denotes a selection signal that is defined as follows:

$$Sel_{i=1} = 1 \quad (5)$$

$$Sel_{i \neq 1} = 0 \quad (6)$$

Accordingly, the selection signals for the first inverter cell section of the first inverter cell out of the $2^{M_2}$ first inverter cells are as follows:

$$S_1^1 = \overline{Sel_i} + \overline{Out_{Di}} = 0 + \overline{Out_{Di}} = \overline{Out_{Di}} \quad (7)$$

$$S_2^1 = Sel_i \cdot \overline{Out_{Di}} = 1 \cdot \overline{Out_{Di}} = \overline{Out_{Di}} \quad (8)$$

$$S_3^1 = Sel_i + \overline{Out_{Di}} = 1 + \overline{Out_{Di}} = 1 \quad (9)$$

$$S_4^1 = \overline{Sel_i} \cdot Out_{Di} = 0 \cdot Out_{Di} = 0 \quad (10)$$

For the first inverter cell sections of all the other first inverter cell out of the $2^{M_2}$ first inverter cells, the selection signals are:

$$S_1^{i \neq 1} = \overline{Sel_i} + \overline{Out_{Di}} = 1 + \overline{Out_{Di}} = 1 \quad (11)$$

$$S_2^{i \neq 1} = Sel_i \cdot \overline{Out_{Di}} = 0 \cdot \overline{Out_{Di}} = 0 \quad (12)$$

$$S_3^{i \neq 1} = Sel_i + \overline{Out_{Di}} = 0 + \overline{Out_{Di}} = \overline{Out_{Di}} \quad (13)$$

$$S_4^{i \neq 1} = \overline{Sel_i} \cdot Out_{Di} = 1 \cdot Out_{Di} = Out_{Di} \quad (14)$$

For the first inverter cell section of the first (i=1) inverter cell out of the $2^{M_2}$ first inverter cells, the selection signal is high ($Sel_{i=1}=1$). Accordingly, the first inverter cell section of the first inverter cell out of the $2^{M_2}$ first inverter cells is responsive to the first interpolation signal $Ph_1$. For the first inverter cell sections of the other inverter cells out of the $2^{M_2}$ first inverter cells, the selection signal is low ($Sel_{i \neq 1}=0$). Accordingly, the first inverter cell sections of the other inverter cells out of the $2^{M_2}$ first inverter cells are responsive to the second interpolation signal $Ph_2$. That is, the second interpolation signal $Ph_2$ is output $2^{M_2}-1$ times, whereas the first interpolation signal $Ph_1$ is output one time by the $2^{M_2}$ first inverter cells. In other words, the second interpolation signal $Ph_2$ is weighted by the weighting factor $2^{M_2}-1$. The sum of the first inverter cell section output signals of the $2^{M_2}$ first inverter cells is the output interpolation signals 401 of apparatus.

Upon transition of the first inverter cell section output signal $Out_{Di}$ of the $i^{th}$ first inverter cell section 460-1, the output of the first inverter cell section is floating. Hence, contention between inverters of different first inverter cell sections can be avoided.

Similarly, the second inverter cell sections of the $2^{M_2}$ first inverter cells may provide respective second inverter cell section output signals, which are summed to the other output interpolation signals 402 of apparatus 400.

Although apparatus 400 is illustrated as differential implementation, it is evident that the above described technique for contention-free weighting may also be used for single ended implementations. For example, the inverter cells may be provided with only one of the first inverter cell section and the second inverter cell section for processing single ended signals.

Figure 5:
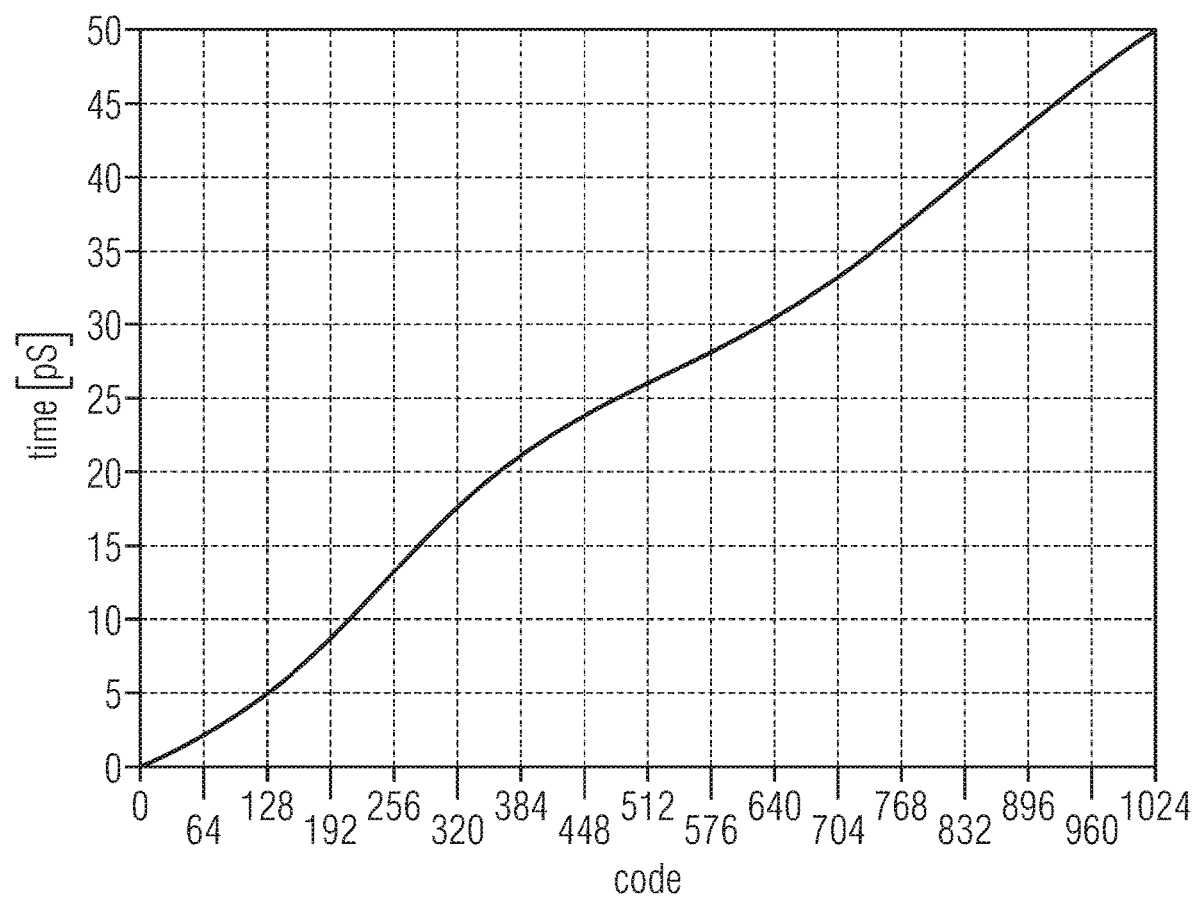
FIG. 5 illustrates an example of delay time vs. code.

In the following some characteristics of signal interpolation according to one or more aspects of the proposed technique are described in connection with FIGS. 5 to 8. FIG. 5 illustrates delay time vs. code, i.e. the time delay (phase shift) of the resulting output interpolation signal (e.g. signal 105, signal 201 or signal 301 as illustrated in FIGS. 1, 2 and 3) with respect to the first signal as a function of the code (value) represented by the code word. It is evident from FIG. 5 that the time delay increases monotonically for increasing code.

Figure 6:
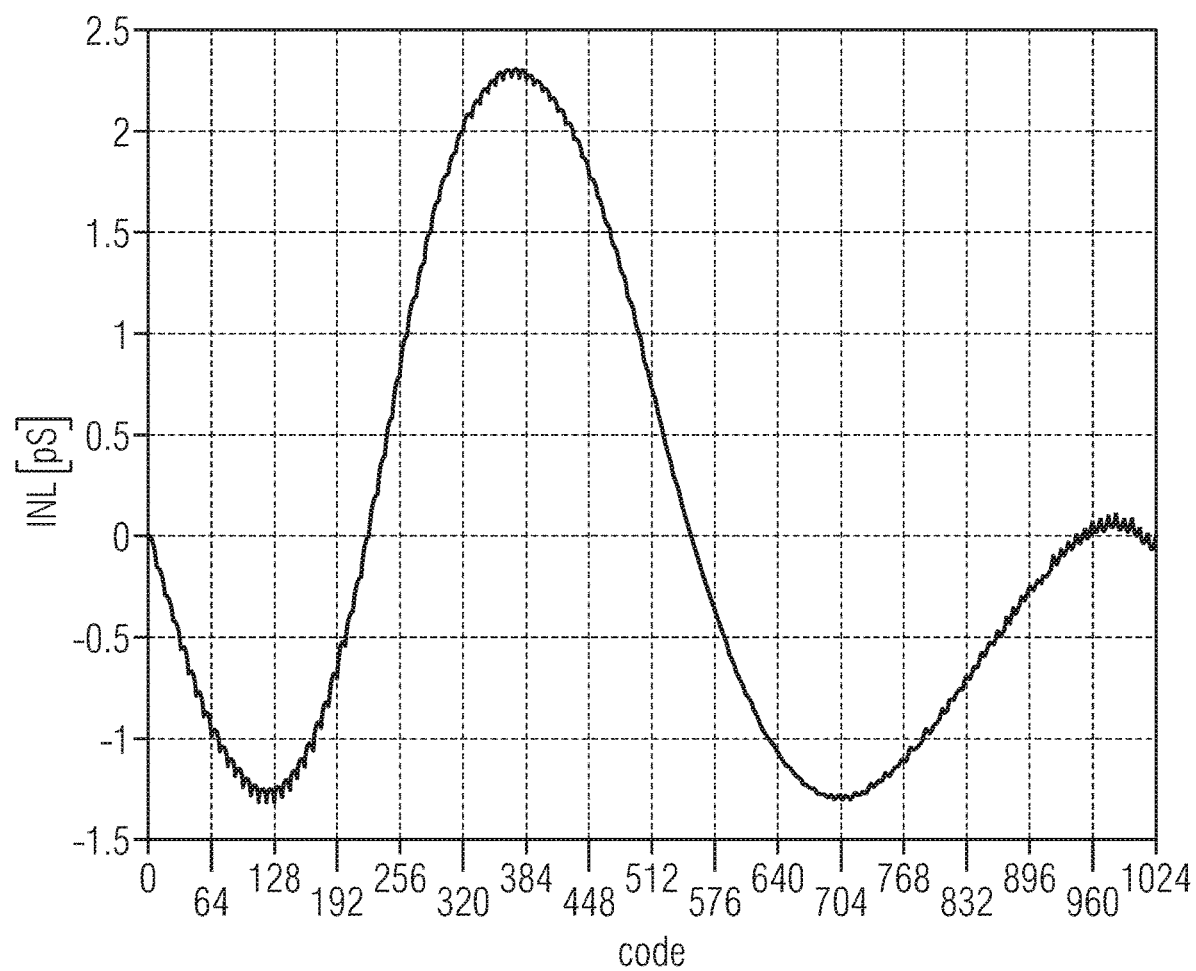
FIG. 6 illustrates an example of Integrated NonLinearity (INL) vs. code.
Figure 7:
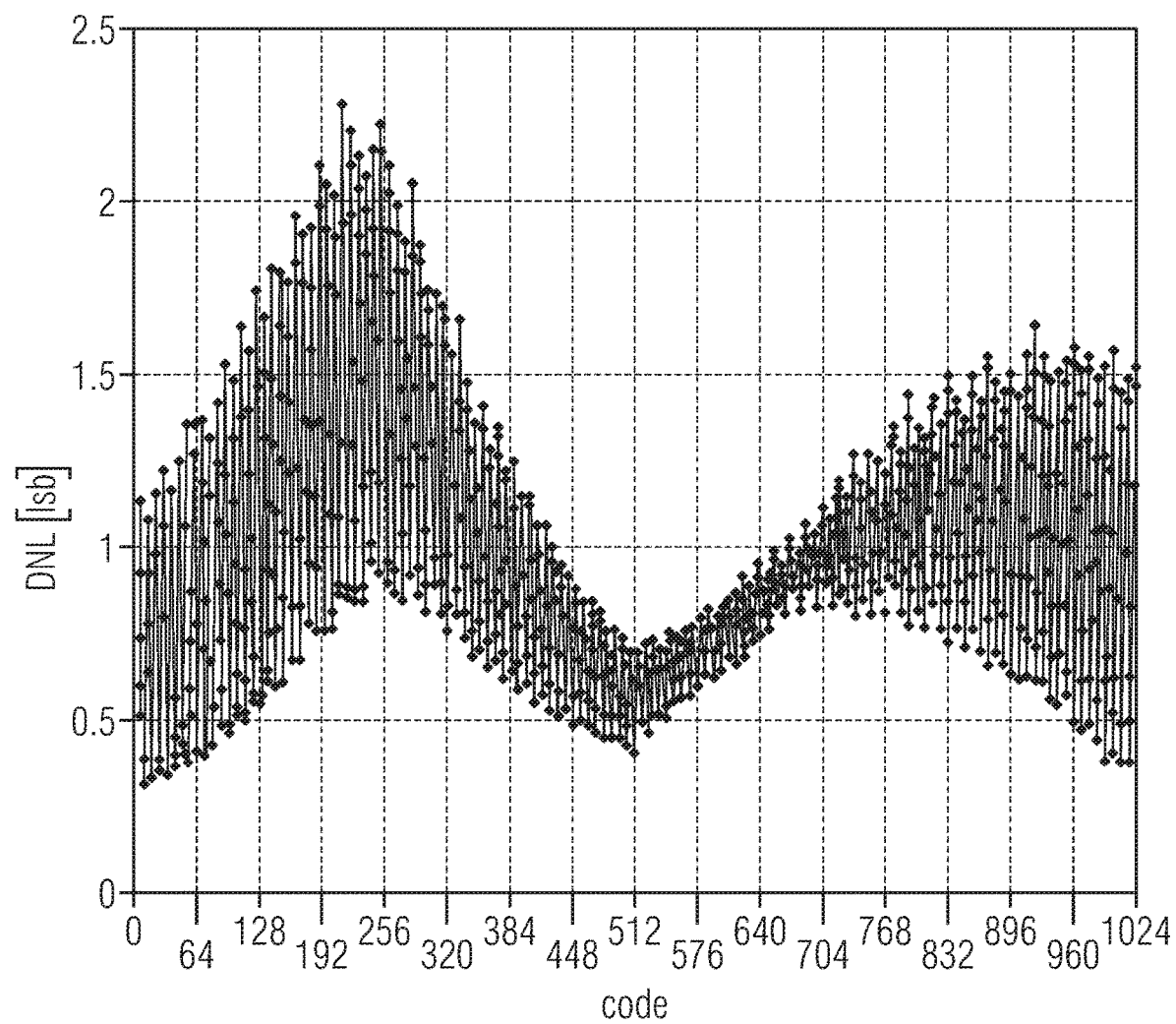
FIG. 7 illustrates an example of Differential NonLinearity (DNL) vs. code.

Further, FIG. 6 illustrates the INL (in picoseconds) of the resulting output interpolation signal vs. code and FIG. 7 illustrates the DNL (in LSBs) of the resulting output interpolation signal vs. code. It is evident from FIGS. 6 and 7 that the resulting output interpolation signal is monotous.

Signal interpolation according to the proposed technique may be used in a DTC for time (or phase) manipulation of a desired signal based on a (digital) control word. Examples of the present disclosure, hence, further relate to a DTC comprising an apparatus for interpolating between a first signal and a second signal according to one or more aspects of the proposed technique or one or more examples described herein.

Apparatuses according to the proposed technique may, e.g., use DCEI interpolation cells. Accordingly, the proposed technique may allow to extend the DCEI interpolation array concept to any number N of consecutive interpolation stages. This may further allow to extend the dynamic range of the DCEI to practically any number of bits without doubling the array size, but through adding a following properly scaled interpolation stage. Also, improved power and performance may be enabled. This may in turn allow for improved control of the power consumption and noise by proper partitioning of the interpolation stages while assuring monotonicity and full and exact coverage. The proposed technique may, hence, enable an $N^{th}$ order DCEI (e.g. used in a DTC).

For low power applications, the proposed $DCEI^N$ technique may allow for better power/performance optimization of the DCEI-DTC. This may further allow for usage in low power applications like using DTX for Bluetooth or GSM, or using a low jitter DTC for clocking. For high-end applications, the proposed technique may allow the natural extension to a large number of bits required by cellular high end applications, and the flexibility to control the number of bits and power on the fly.

In other words, the proposed technique may allow to extend the concept of edge interpolation to any number of stages, allowing the increase of the dynamic range of a DTC to any number of bits with the ability to control the power/noise/quantization trade-off better.

Figure 8:
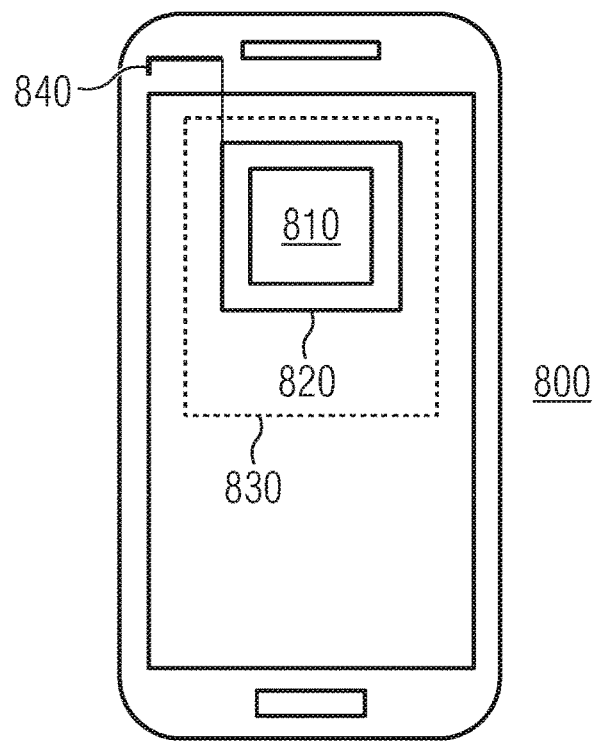
FIG. 8 illustrates an example of a mobile device comprising an apparatus for interpolating between a first signal and a second signal.

An example of an implementation using an apparatus for interpolating between a first signal and a second signal according to one or more aspects of the proposed technique or one or more examples described above is illustrated in FIG. 8. FIG. 8 schematically illustrates an example of a mobile device 800 (e.g. mobile phone, smartphone, tablet-computer, or laptop) comprising an apparatus 810 for interpolating between a first signal and a second signal according to an example described herein.

As described above, DTCs may use apparatus 810. Accordingly, a DTC 820 of mobile device 800 comprises apparatus 810. For example, DTC 820 may be part of a radio frequency transceiver (transmitter) 830 for radio frequency signal generation. Radio frequency transceiver 830 is coupled to antenna element 840 for radiating the radio frequency signal to the environment.

The mobile device 800 may comprise further elements such as, e.g., an application processor, a baseband processor, memory, an audio driver, a camera driver, a touch screen, a display driver, sensors, removable memory, a power management integrated circuit or a smart battery.

To this end, a mobile device having reduced current consumption and increased DTC resolution may be provided.

The above wireless communication circuits using signal interpolation or DTCs according to the proposed technique or one or more of the examples described above may be configured to operate according to one of the $3^{rd}$ Generation Partnership Project (3GPP)—standardized mobile communication networks or systems. The mobile or wireless communication system may correspond to, for example, a Long-Term Evolution (LTE), an LTE-Advanced (LTE-A), High Speed Packet Access (HSPA), a Universal Mobile Telecommunication System (UMTS) or a UMTS Terrestrial Radio Access Network (UTRAN), an evolved-UTRAN (e-UTRAN), a Global System for Mobile communication (GSM) or Enhanced Data rates for GSM Evolution (EDGE) network, a GSM/EDGE Radio Access Network (GERAN). Alternatively, the wireless communication circuits may be configured to operate according to mobile communication networks with different standards, for example, a Worldwide Inter-operability for Microwave Access (WIMAX) network IEEE 802.16 or Wireless Local Area Network (WLAN) IEEE 802.11, generally an Orthogonal Frequency Division Multiple Access (OFDMA) network, a Time Division Multiple Access (TDMA) network, a Code Division Multiple Access (CDMA) network, a Wideband-CDMA (WCDMA) network, a Frequency Division Multiple Access (FDMA) network, a Spatial Division Multiple Access (SDMA) network, etc.

Figure 9:
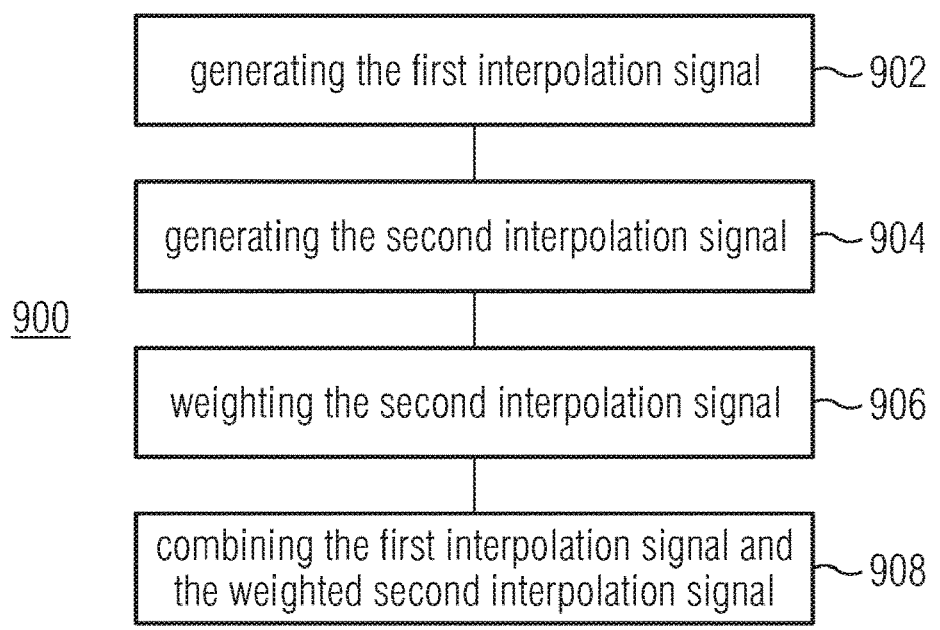
FIG. 9 illustrates a flowchart of an example of a method for interpolating between a first signal and a second signal.

An example of a method 900 for interpolating between a first signal and a second signal is illustrated by means of a flowchart in FIG. 9. Method 900 comprises generating 902 a first interpolation signal at a first node using a first plurality of interpolation cells. At least one of the first plurality of interpolation cells is configured to supply, based on a first number of bits of a control word, at least one of the first signal and the second signal to the first node. Further, method 900 comprises generating 904 a second interpolation signal at a second node using a second plurality of interpolation cells. At least one of the second plurality of interpolation cells is configured to supply, based on a second number of bits of the control word, at least one of the first signal and the second signal to the second node. Additionally, method 900 comprises weighting 906 the second interpolation signal based on a weighting factor, and combining 908 the first interpolation signal and the weighted second interpolation signal to generate a third interpolation signal.

More details and aspects of the method are mentioned in connection with the proposed technique or one or more examples described above (e.g. FIGS. 1 to 8). The method may comprise one or more additional optional features corresponding to one or more aspects of the proposed technique or one or more examples described above.

Although the proposed technique is described above in connection with wireless communication, the proposed technique may be applied to field of technology requiring/using signal interpolation.

The examples as described herein may be summarized as follows:

Example 1 is an apparatus for interpolating between a first signal and a second signal, comprising: a first plurality of interpolation cells configured to generate a first interpolation signal at a first node, wherein at least one of the first plurality of interpolation cells is configured to supply, based on a first number of bits of a control word, at least one of the first signal and the second signal to the first node; a second plurality of interpolation cells configured to generate a second interpolation signal at a second node, wherein at least one of the second plurality of interpolation cells is configured to supply, based on a second number of bits of the control word, at least one of the first signal and the second signal to the second node; and an interpolation circuit configured to weight the second interpolation signal based on a weighting factor, and to combine the first interpolation signal and the weighted second interpolation signal to generate a third interpolation signal.

In example 2, the second plurality of interpolation cells in the apparatus of example 1 comprises $2^{M_2}-1$ interpolation cells with $M_2$ denoting the second number of bits of the control word.

In example 3, the weighting factor in the apparatus of example 1 or example 2 is based on the number of interpolation cells in the second plurality of interpolation cells.

In example 4, the weighting factor in the apparatus of example 3 is $2^{M_2}-1$ with $M_2$ denoting the second number of bits of the control word.

In example 5, the apparatus of any of examples 1 to 4 further comprises a third plurality of interpolation cells configured to generate a fourth interpolation signal at a third node, wherein at least one of the third plurality of interpolation cells is configured to supply, based on a third number of bits of the control word, at least one of the first signal and the second signal to the third node, wherein the interpolation circuit is configured to weight the fourth interpolation signal based on a second weighting factor, and to combine the third interpolation signal and the weighted fourth interpolation signal to generate a fifth interpolation signal.

In example 6, the third plurality of interpolation cells in the apparatus of example 5 comprises $2^{M_3}-1$ interpolation cells with $M_3$ denoting the third number of bits of the control word.

In example 7, the second weighting factor in the apparatus of example 5 or example 6 is based on the number of interpolation cells in the third plurality of interpolation cells.

In example 8, the second weighting factor in the apparatus of any of examples 5 to 7 is $2^{M_3}-1$ with $M_3$ denoting the third number of bits of the control word.

In example 9, the apparatus of any of examples 1 to 4 further comprises a third plurality of interpolation cells configured to generate a fourth interpolation signal at a third node, wherein at least one of the third plurality of interpolation cells is configured to supply, based on a third number of bits of the control word, at least one the first signal and the second signal to the third node, wherein the interpolation circuit is configured to weight the fourth interpolation signal based on a second weighting factor, and to combine the first interpolation signal, the weighted second interpolation signal and the weighted fourth interpolation signal to generate the third interpolation signal.

In example 10, the third plurality of interpolation cells in the apparatus of example 9 comprises $2^{M_3}-1$ interpolation cells with $M_3$ denoting the third number of bits of the control word.

In example 11, the second weighting factor in the apparatus of example 10 is based on the number of interpolation cells in the third plurality of interpolation cells and the number of interpolation cells in the second plurality of interpolation cells.

In example 12, the second weighting factor in the apparatus of example 11 is $2^{M_2+M_3}-1$ with $M_2$ denoting the second number of bits of the control word and $M_3$ denoting the third number of bits of the control word.

In example 13, the interpolation circuit in the apparatus of any of the preceding examples comprises: one first inverter configured to receive the first interpolation signal; and a plurality of second inverters each configured to receive the second interpolation signal; and a signal combiner configured to combine outputs of the first inverter and the second inverters to the third interpolation signal.

In example 14, the number of the second inverters in the apparatus of example 13 is equal to the weighting factor.

In example 15, the interpolation circuit in the apparatus of example 13 or example 14 comprises: one third inverter configured to receive the third interpolation signal; a plurality of fourth inverters each configured to receive the fourth interpolation signal, wherein the number of the fourth inverters is equal to the second weighting factor; and a second signal combiner configured to combine outputs of the third inverter and the fourth inverters to the fifth interpolation signal.

In example 16, the interpolation circuit in the apparatus example 13 or example 14 comprises: a plurality of third inverters each configured to receive the fourth interpolation signal, wherein the number of the fourth inverters is equal to the second weighting factor, wherein the signal combiner is configured to combine outputs of the of the first inverter, the second inverters and the third inverters to the third interpolation signal.

In example 17, the first plurality of interpolation cells in the apparatus of any of the preceding examples comprises $2^{M_1}$ interpolation cells with $M_1$ denoting the first number of bits of the control word.

In example 18, the second signal in the apparatus of any of the preceding examples is a phase shifted replica of the first signal.

In example 19, the first plurality of interpolation cells in the apparatus of any of the preceding examples is further configured to generate a fourth interpolation signal at a fourth node, the fourth interpolation signal being inverted with respect to the first interpolation signal, wherein the second plurality of interpolation cells is further configured to generate a fifth interpolation signal at a fifth node, the fifth interpolation signal being inverted with respect to the second interpolation signal, and wherein the interpolation circuit is further configured to weight the fifth interpolation signal based on the weighting factor, and to combine the fourth interpolation signal and the weighted fifth interpolation signal to generate a sixth interpolation signal.

Example 20 is a digital-to-time converter comprising an apparatus for interpolating between a first signal and a second signal according to any of examples 1 to 19.

Example 21 is a mobile device comprising a digital-to-time converter according to example 20.

In example 22, the digital-to-time converter in the mobile device of example 21 is part of a radio frequency transceiver.

Example 23 is a method for interpolating between a first signal and a second signal, comprising: generating a first interpolation signal at a first node using a first plurality of interpolation cells, wherein at least one of the first plurality of interpolation cells is configured to supply, based on a first number of bits of a control word, at least one of the first signal and the second signal to the first node; generating a second interpolation signal at a second node using a second plurality of interpolation cells, wherein at least one of the second plurality of interpolation cells is configured to supply, based on a second number of bits of the control word, at least one of the first signal and the second signal to the second node; weighting the second interpolation signal based on a weighting factor; and combining the first interpolation signal and the weighted second interpolation signal to generate a third interpolation signal.

In example 24, the second plurality of interpolation cells in the method of example 23 comprises $2^{M_2}-1$ interpolation cells with $M_2$ denoting the second number of bits of the control word.

In example 25, the weighting factor in the method of example 23 or example 24 is based on the number of interpolation cells in the second plurality of interpolation cells.

In example 26, the weighting factor in the apparatus of example 25 is $2^{M_2}-1$ with $M_2$ denoting the second number of bits of the control word.

In example 27, the method of any of examples 23 to 26 further comprises: generating a fourth interpolation signal at a third node using a third plurality of interpolation cells, wherein at least one of the third plurality of interpolation cells is configured to supply, based on a third number of bits of the control word, at least one of the first signal and the second signal to the third node; weighting the fourth interpolation signal based on a second weighting factor; and combining the third interpolation signal and the weighted fourth interpolation signal to generate a fifth interpolation signal.

In example 28, the third plurality of interpolation cells in the method of example 27 comprises $2^{M_3}-1$ interpolation cells with $M_3$ denoting the third number of bits of the control word.

In example 29, the second weighting factor in the method of example 27 or example 28 is based on the number of interpolation cells in the third plurality of interpolation cells.

In example 30, the second weighting factor in the method of any of examples 27 to 29 is $2^{M_3}-1$ with $M_3$ denoting the third number of bits of the control word.

In example 31, the method of any of examples 23 to 26 further comprises: generating a fourth interpolation signal at a third node using a third plurality of interpolation cells, wherein at least one of the third plurality of interpolation cells is configured to supply, based on a third number of bits of the control word, at least one of the first signal and the second signal to the third node; weighting the fourth interpolation signal based on a second weighting factor; and combining the first interpolation signal, the weighted second interpolation signal and the weighted fourth interpolation signal to generate the third interpolation signal.

In example 32, the third plurality of interpolation cells in the method of example 31 comprises $2^{M_3}-1$ interpolation cells with $M_3$ denoting the third number of bits of the control word.

In example 33, the second weighting factor in the method of example 32 is based on the number of interpolation cells in the third plurality of interpolation cells and the number of interpolation cells in the second plurality of interpolation cells.

In example 34, the second weighting factor in the method of example 33 is $2^{M_2+M_3}-1$ with $M_2$ denoting the second number of bits of the control word and $M_3$ denoting the third number of bits of the control word.

In example 35, the first plurality of interpolation cells in the method of any of examples 23 to 34 comprises $2^{M_1}$ interpolation cells with $M_1$ denoting the first number of bits of the control word.

In example 36, the second signal in the method of any of examples 23 to 35 is a phase shifted replica of the first signal.

In example 37, the method of any of examples 23 to 36 further comprises: generating a fourth interpolation signal at a fourth node using the first plurality of interpolation cells, the fourth interpolation signal being inverted with respect to the first interpolation signal; generating a fifth interpolation signal at a fifth node using the second plurality of interpolation cells, the fifth interpolation signal being inverted with respect to the second interpolation signal; weighting the fifth interpolation signal based on the weighting factor; and combining the fourth interpolation signal and the weighted fifth interpolation signal to generate a sixth interpolation signal.

The aspects and features mentioned and described together with one or more of the previously detailed examples and figures, may as well be combined with one or more of the other examples in order to replace a like feature of the other example or in order to additionally introduce the feature to the other example.

The description and drawings merely illustrate the principles of the disclosure. Furthermore, all examples recited herein are principally intended expressly to be only for pedagogical purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

A block diagram may, for instance, illustrate a high-level circuit diagram implementing the principles of the disclosure. Similarly, a flow chart, a flow diagram, a state transition diagram, a pseudo code, and the like may represent various processes, operations or steps, which may, for instance, be substantially represented in computer readable medium and so executed by a computer or processor, whether or not such computer or processor is explicitly shown. Methods disclosed in the specification or in the claims may be implemented by a device having means for performing each of the respective acts of these methods.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are explicitly proposed herein unless it is stated that a specific combination is not intended. Furthermore, it is intended to include also features of a claim to any other independent claim even if this claim is not directly made dependent to the independent claim.

What is claimed is:

1. An apparatus for interpolating between a first signal and a second signal, comprising:
    a first plurality of interpolation cells configured to generate a first interpolation signal at a first node, wherein at least one of the first plurality of interpolation cells is configured to supply, based on a first number of bits of a control word, at least one of the first signal and the second signal to the first node;
    a second plurality of interpolation cells configured to generate a second interpolation signal at a second node, wherein at least one of the second plurality of interpolation cells is configured to supply, based on a second number of bits of the control word, at least one of the first signal and the second signal to the second node; and
    an interpolation circuit configured to weight the second interpolation signal based on a weighting factor, and to combine the first interpolation signal and the weighted second interpolation signal to generate a third interpolation signal.

2. The apparatus of claim 1, wherein the second plurality of interpolation cells comprises $2^{M_2}-1$ interpolation cells with $M_2$ denoting the second number of bits of the control word.

3. The apparatus of claim 1, wherein the weighting factor is based on the number of interpolation cells in the second plurality of interpolation cells.

4. The apparatus of claim 3, wherein the weighting factor is $2^{M_2}-1$ with $M_2$ denoting the second number of bits of the control word.

5. The apparatus of claim 1, further comprising:
a third plurality of interpolation cells configured to generate a fourth interpolation signal at a third node, wherein at least one of the third plurality of interpolation cells is configured to supply, based on a third number of bits of the control word, at least one of the first signal and the second signal to the third node,
wherein the interpolation circuit is configured to weight the fourth interpolation signal based on a second weighting factor, and to combine the third interpolation signal and the weighted fourth interpolation signal to generate a fifth interpolation signal.

6. The apparatus of claim 5, wherein the third plurality of interpolation cells comprises $2^{M_3}-1$ interpolation cells with $M_3$ denoting the third number of bits of the control word.

7. The apparatus of claim 5, wherein the second weighting factor is based on the number of interpolation cells in the third plurality of interpolation cells.

8. The apparatus of claim 5, wherein the second weighting factor is $2^{M_3}-1$ with $M_3$ denoting the third number of bits of the control word.

9. The apparatus of claim 5, wherein the interpolation circuit comprises:
one first inverter configured to receive the first interpolation signal;
a plurality of second inverters each configured to receive the second interpolation signal;
a first signal combiner configured to combine outputs of the first inverter and the second inverters to the third interpolation signal;
one third inverter configured to receive the third interpolation signal;
a plurality of fourth inverters each configured to receive the fourth interpolation signal, wherein the number of the fourth inverters is equal to the second weighting factor; and
a second signal combiner configured to combine outputs of the third inverter and the fourth inverters to the fifth interpolation signal.

10. The apparatus of claim 1, further comprising:
a third plurality of interpolation cells configured to generate a fourth interpolation signal at a third node, wherein at least one of the third plurality of interpolation cells is configured to supply, based on a third number of bits of the control word, at least one the first signal and the second signal to the third node,
wherein the interpolation circuit is configured to weight the fourth interpolation signal based on a second weighting factor, and to combine the first interpolation signal, the weighted second interpolation signal and the weighted fourth interpolation signal to generate the third interpolation signal.

11. The apparatus of claim 9, wherein the interpolation circuit comprises:
one first inverter configured to receive the first interpolation signal;
a plurality of second inverters each configured to receive the second interpolation signal;
a plurality of third inverters each configured to receive the fourth interpolation signal, wherein the number of the fourth inverters is equal to the second weighting factor; and
a signal combiner configured to combine outputs of the of the first inverter, the second inverters and the third inverters to the third interpolation signal.

12. The apparatus of claim 10, wherein the third plurality of interpolation cells comprises $2^{M_3}-1$ interpolation cells with $M_3$ denoting the third number of bits of the control word.

13. The apparatus of claim 12, wherein the second weighting factor is based on the number of interpolation cells in the third plurality of interpolation cells and the number of interpolation cells in the second plurality of interpolation cells.

14. The apparatus of claim 13, wherein the second weighting factor is $2^{M_2+M_3}-1$ with $M_2$ denoting the second number of bits of the control word and $M_3$ denoting the third number of bits of the control word.

15. The apparatus of claim 1, wherein the interpolation circuit comprises:
one first inverter configured to receive the first interpolation signal;
a plurality of second inverters each configured to receive the second interpolation signal; and
a signal combiner configured to combine outputs of the first inverter and the second inverters to the third interpolation signal.

16. The apparatus of claim 15, wherein the number of the second inverters is equal to the weighting factor.

17. The apparatus of claim 1, wherein the first plurality of interpolation cells comprises $2^{M_1}$ interpolation cells with $M_1$ denoting the first number of bits of the control word.

18. The apparatus of claim 1, wherein the second signal is a phase shifted replica of the first signal.

19. The apparatus of claim 1, wherein the first plurality of interpolation cells is further configured to generate a fourth interpolation signal at a fourth node, the fourth interpolation signal being inverted with respect to the first interpolation signal, wherein the second plurality of interpolation cells is further configured to generate a fifth interpolation signal at a fifth node, the fifth interpolation signal being inverted with respect to the second interpolation signal, and wherein the interpolation circuit is further configured to weight the fifth interpolation signal based on the weighting factor, and to combine the fourth interpolation signal and the weighted fifth interpolation signal to generate a sixth interpolation signal.

20. A digital-to-time converter comprising an apparatus for interpolating between a first signal and a second signal according to claim 1.

21. A mobile device comprising a digital-to-time converter according to claim 20.

22. The mobile device of claim 21, wherein the digital-to-time converter is part of a radio frequency transceiver.

23. A method for interpolating between a first signal and a second signal, comprising:
generating a first interpolation signal at a first node using a first plurality of interpolation cells, wherein at least one of the first plurality of interpolation cells is configured to supply, based on a first number of bits of a control word, at least one of the first signal and the second signal to the first node;

generating a second interpolation signal at a second node using a second plurality of interpolation cells, wherein at least one of the second plurality of interpolation cells is configured to supply, based on a second number of bits of the control word, at least one of the first signal and the second signal to the second node;

weighting the second interpolation signal based on a weighting factor; and combining the first interpolation signal and the weighted second interpolation signal to generate a third interpolation signal.

24. The method of claim 23, further comprising:

generating a fourth interpolation signal at a third node using a third plurality of interpolation cells, wherein at least one of the third plurality of interpolation cells is configured to supply, based on a third number of bits of the control word, at least one of the first signal and the second signal to the third node;

weighting the fourth interpolation signal based on a second weighting factor; and combining the third interpolation signal and the weighted fourth interpolation signal to generate a fifth interpolation signal.

25. The method of claim 23, further comprising:

generating a fourth interpolation signal at a third node using a third plurality of interpolation cells, wherein at least one of the third plurality of interpolation cells is configured to supply, based on a third number of bits of the control word, at least one of the first signal and the second signal to the third node;

weighting the fourth interpolation signal based on a second weighting factor; and combining the first interpolation signal, the weighted second interpolation signal and the weighted fourth interpolation signal to generate the third interpolation signal.

* * * * *